United States Patent [19]

Davies et al.

[11] Patent Number: 6,138,659
[45] Date of Patent: Oct. 31, 2000

[54] METHOD OF PREPARING END FACES ON INTEGRATED CIRCUITS

[75] Inventors: Scott Thomas Davies, Dacula; Francis M. Mess, Smyrna, both of Ga.

[73] Assignee: Lucent Technologies Inc., Murray Hill, N.J.

[21] Appl. No.: 09/285,920

[22] Filed: Apr. 2, 1999

[51] Int. Cl.$^7$ ....................................................... B28D 7/04
[52] U.S. Cl. .............................................. 125/35; 451/364
[58] Field of Search ............................... 83/451; 451/364, 451/388; 125/35, 17, 20

[56] References Cited

U.S. PATENT DOCUMENTS 3,004,766  10/1961  Bryant ....................................... 451/388
4,315,494   2/1982  DiPlacido ................................... 125/35
4,924,843   5/1990  Waren ........................................ 125/35

Primary Examiner—Derris H. Banks

[57] ABSTRACT

A method and apparatus for preparing end faces of integrated circuit chips using a cutting machine having a straight blade. The apparatus is a wedge shaped block having one surface angled at the desired angle to be imparted to the end face. The one surface has an alignment member thereon for aligning the chip on the top surface, and at least one locating member at the end of the block for positioning the end of the chip relative to the cutting blade. The block has a plurality of bores therein for applying suction to hold the chip on the one surface during cutting with the blade. The method includes the steps of placing a foot or feet on the chip, placing the chip on the block and aligning it and locating it, and applying a force thereto to hold it fixedly in position.

13 Claims, 4 Drawing Sheets

METHOD OF PREPARING END FACES ON INTEGRATED CIRCUITS

FIELD OF THE INVENTION

This invention relates to a method and apparatus for preparing optical integrated circuits for packaging and, more particularly, to a method and apparatus for dicing and preparing integrated circuit dies or chips for connection to optical fibers.

BACKGROUND OF THE INVENTION

Optical integrated circuits (OIC's) generally are fabricated on silicon wafers which are planar in structure. Several oxide layers are usually deposited on the wafers, and the integrated circuits themselves actually reside in the oxide layers. The usual practice is to form a plurality of such circuits on the wafer, and then to cut individual dies containing circuits therefrom (dicing). In use, optical signals carried by optical fibers are connected to the circuit on the silicon device, with the input signal entering the device at one end and exiting the device at the other end as an output signal, after processing by the integrated circuit. Connection of the fibers to the OIC die or chip involves an interface between each fiber and the chip, and it is common practice to terminate each fiber to be connected with a V-groove chip assembly made of silicon or ceramic which provides a means to align and attach the fibers to the inputs and outputs of the OIC chip. A 90° end face on the silicon chip and on the OIC chip or die would be the easiest to align and attach. However, the flat 90° faces would produce large amounts of back reflection, resulting in serious and highly undesirable signal degradation.

It is common practice in the prior art arrangements to impart an angle to the input or output face of the OIC die, and a corresponding complementary angle to the end of the V-groove terminating chip to minimize back reflection. The particular angle of the faces must be chosen with care to insure a proper physical connection and acceptable back reflection levels. Thus, the angle may vary from five (5°) to twelve (12°) degrees, for example, depending on the ultimate function of the OIC chip, but it has been found that eight degrees (8°) is usually the minimum angle allowable to reduce back reflection to acceptable levels. Angles greater than eight degrees will reduce back reflection still more, but angles greater than ten (10) to twelve (12) degrees involve other manufacturing concerns, such as wastage of material, and, at least up to now, increased processing time which is economically undesirable. For angles less than eight degrees, back reflection increases rapidly, while for angles greater than twelve degrees, too much material has to be removed by current lapping and polishing processes, thus an angle range of approximately 8° to 12° is preferred.

Dicing, a commercially available process, has been used by the integrated circuit industry for many years, and has also been used in the manufacture of Optical Application Specific Integrated Circuits (OASIC) such as, for example, dense wavelength division multiplexers (DWDM's). Dicing usually involves the use of an abrasive-coated blade rotating at high speeds in the presence of a coolant fluid. Although the blade dimensions and characteristics may vary, typically the blade is planar and quite thin, with no included angle between the front and back faces of the blade. Such a rotating blade is used to separate individual OIC dies from the silicon wafer. It is a primary concern that the damage to the substrate that can result from this dicing operation be minimized. Such damage can result in poor device performance, or even catastrophic failure such as by fracture. Present day techniques for minimizing such damage call for making multiple cut passes in the same location using different blades. Thus, a beveled blade may be used to make a preliminary cut of less than full depth followed by a straight blade which makes the through cut. Angled blades typically leave less subsurface damage on the top surface of the wafer or die than do straight blades. Thus, a beveled blade makes a first cut which is wider than the following through-cut by a straight blade. The net effect of such a technique is a reduction in damage to the circuit substrate.

After the die or chip has been cut from the wafer, connector feet are mounted on the die and the rotating blade is used to trim the foot to the desired dimensions. The desired angular interface is then formed by lapping and polishing, which involves the use of an abrasive carrying slurry and some sort of mechanism to generate relative motion between the workpiece, e.g., the OASIC device, and a work surface, i.e., the lapping or polishing plate. The desired interface angle, such as eight degrees, is formed during the lapping and polishing, by the precise removal of material. The removal of material is a relatively slow process, and requires extensive training and a high level of skill on the part of the operator. For a smoothly operating production line, inclusion of an individual into the line, as with the prior art process, is, for the foregoing reasons, highly undesirable. In addition, the lapping and polishing equipment is both expensive and requires a high degree of maintenance, thereby adding to the cost involved in producing the desired end result. Furthermore, the process as thus far described requires several work stations and several operators with varying levels of required skill, thereby making the process, especially from a production standpoint, both slow and expensive. As will be discussed more fully hereinafter, the entire process involves approximately eleven steps extended over several hours which, in a production environment, means that the lapping and polishing steps govern the speed of the production line creating a most undesirable slow-down and a most undesirable increase in production costs.

In U.S. patent application Ser. No. 09/015,464 of Davies et al., filed Jan. 29, 1998, the disclosure of which is incorporated herein by reference, there is shown an apparatus and process for preparing optical integrated circuit dies or chips for connection and/or packaging, which drastically reduces the production time, number of involved personnel, and number of work stations that heretofore have been necessary, while at the same time, producing a uniformity of results that has not been a characteristic of prior art processes.

In the invention of that application, after a die containing the integrated circuit has been separated from the wafer, feet are mounted thereon, as by epoxy, to provide a matching surface for the V-groove chip terminations of the optical fibers. The die is then mounted to, preferably, a tape mount, which is commonly used in the prior art. After mounting, the die and foot are cut by a rotating beveled blade having an included angle of from sixteen to twenty-four degrees, thereby forming an eight to twelve degree angle on the end faces of the die and the foot, after which the mounting tape is removed from the completed die. It has been found that such an angled blade produces operative faces of exceptional smoothness.

The elapsed time for performance of the entire process of that invention is an order of magnitude less than for the prior art process, as will become clear hereinafter, and acceptable operative end faces are produced. It has been found, however, that, in a high production environment, a beveled blade sometimes acquires a non-planar profile after cutting several devices, primarily due to the different layers of material encountered during the cutting operation. When this does occur, the blade has to be replaced, necessitating a temporary halt in the production process.

SUMMARY OF THE INVENTION

The present invention is both an apparatus and a method for angle dicing as applied to, for example, an OASIC packaging operation wherein the angle face produced thereby is a functional surface, eliminating the need for lapping and polishing. The invention drastically increases manufacturing capacity in comparison to current polishing techniques, and reduces the necessity for frequent blade replacements.

In a preferred embodiment of the invention, the apparatus comprises a wedge shaped angle block, the planar top surface of which is adapted to receive a chip to be cut. The block has a plurality of holes therein extending from the top surface to the bottom surface. When a vacuum or suction is applied to the holes, the chip on the top surface is held firmly in place so that it does not move during the cutting operation. The top surface of the block which is at an angle of 8° to 12° relative to the planar bottom surface of the block, or at an angle of 78° to 82° relative to the straight cutting blade, has an alignment rail for aligning the chip thereon, and a locating rail extending across the end for positioning the end of the chip relative to the cutting blade. A second locating rail may also be located at the other end of the block for the same purpose. Instead of rails, the locating means may comprise upstanding legs at either side of the cutting area.

The block is, in use, mounted on a resilient sheet of plastic, such as blue tape which, in turn, is mounted on a cutting ring, which is a component of a standard cutting machine. The plastic sheet has an opening therein beneath the block to allow the vacuum force to be applied to the block, and has a tacky or adhesive surface for holding the block thereon. The block may have, and preferably does have, an alignment groove extending thereacross for optically aligning the block in the cutting machine.

The cutting wheel is a straight wheel, hence, less subject to irregular wear, and, in operation, cuts through the end of the chip which, with the chip being mounted on the angled block, results in an end face of the desired angle, which is usable without further lapping or polishing.

In operation, the block is placed on the plastic sheet and optically aligned, the chip, after end feet are mounted thereto, as by cementing, is laid upon the top surface abutting the alignment rail and one of the locating members thereby aligning and locating the chip relative to the cutting blade, and a suction force is applied to the chip through the holes in the block. The carrier, which is the ring and the plastic sheet, with the block affixed thereto, is moved into the cutting region, and the straight cutter of the machine cuts the end face of the chip, which, because of the slope of the block, will have an end face at the desired angle.

The apparatus and method of the invention produces a greatly enhanced geometric uniformity over prior art arrangements which results in increased ease of assembly downstream of the cutting of the end face. There also results a concomitant reduction in cost of manufacture due to a reduction in direct labor per device.

These and other features and advantages of the present invention will be readily apparent from the following detailed description, read in conjunction with the accompanying drawings.

DETAILED DESCRIPTION

Figure 1:
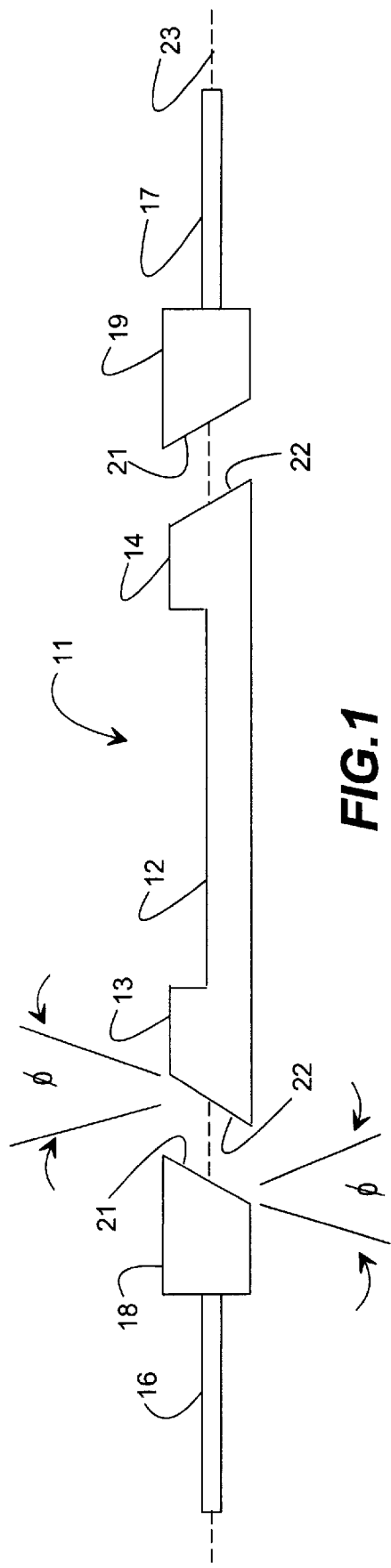
FIG. 1 is a side elevation view of an optical integrated circuit chip and connections thereto.

In FIG. 1 there is shown a die or chip 11 which comprises a planar silicon member 12, which contains an optical integrated circuit, not shown, and which has, at each end, a connector foot 13, 14, preferably of glass or silicon. Optical fiber connections to the chip 11 are made with optical fibers 16, 17, terminated in V-groove chips 18, 19, respectively. As was discussed previously, it is desirable for the operative interface between each terminating chip 18, 19 and the chip 11 be at an angle to reduce back reflections. If the angle $\phi$ as shown in FIG. 1 is zero degrees (0°) the face 21 of each terminating chip 18, 19 and the face 22 of the chip 12 and foot 13, 14 is normal to the axis 23, then there will be a large amount of signal reflection at the interface and a consequent unacceptable signal degradation. On the other hand, if the angle $\phi$ is approximately forty-five degrees (45°) or more, the end faces function as mirrors and deflect the signal to a new path at approximately right angles to its original direction of propagation. Thus, the angle $\phi$ at the interface can fall within the range of 0° to 45°, but the outer portions of the range can produce unacceptable back-reflection on the one hand or too great signal deflection on the other hand. It has been found that when the angle $\phi$ is within a range of eight degrees (8°) to twelve degrees (12°), the signal loss due to reflection or deflection is within acceptable limits. Preferably, the angle $\phi$ should be in the low end of the range, i.e., approximately 8° to eliminate the necessity of creating too much waste material.

Figure 3:
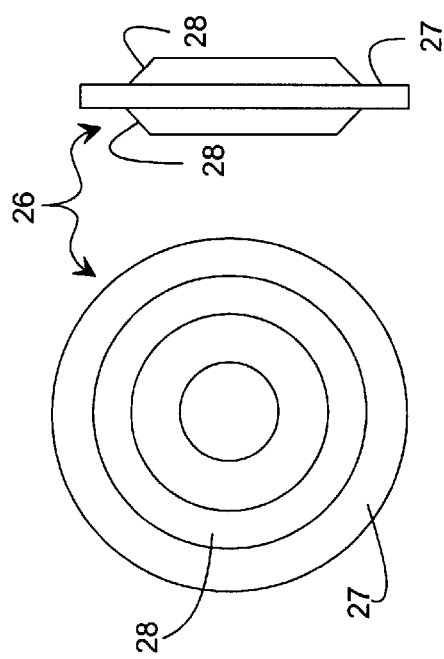
FIG. 3 is a composite view of the cutting blade used in the arrangement of FIG. 2 and with the present invention.
Figure 2:
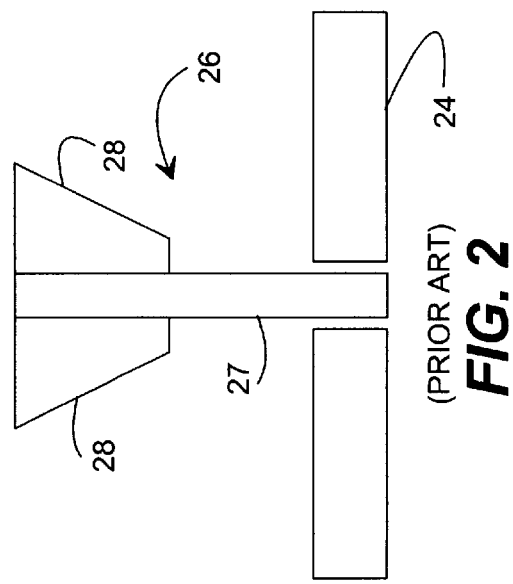
FIG. 2 is an elevation view of a prior art method of dicing a silicon wafer having integrated circuit chips incorporated therein.

Heretofore, in order to achieve the interface configuration shown in FIG. 1, it has been the practice to make a straight ninety degree (90°) cut through a silicon wafer 24, which contains a plurality of individual dies or chips, by means of a straight, thin rotating diamond saw 26. Such a process, known as dicing, is shown in FIG. 2, and the diamond saw 26, which consists of a blade 27 held between two flanges 28, is shown in FIG. 3. After a die or chip 11 has been separated from the wafer, the feet 13 and 14 are mounted thereon with, for example, epoxy cement, and any overhang of a foot is trimmed off by the blade 27. The dicing process is usually a two step operation which is more often used for IC's instead of OIC's, in which a beveled blade is used to make a V-shaped cut in the wafer after which the straight blade 27 makes the dicing cut. This two-step dicing process has been found to reduce damage to the wafer 24 in the area of the cut by a considerable amount.

After the feet 13 and 14 have been trimmed, it is the current practice in the prior art to lap and polish the end faces 22 of the die 12 and feet 13 and 14 until the desired interface angle φ has been achieved. Lapping and polishing is a time consuming process, as well as being labor intensive. On average, lapping and polishing requires approximately one hour per device in direct labor time in addition to time-intensive set-up and clean-up process steps. In addition, lapping and polishing requires the design and fabrication of device-specific fixtures for devices of differing geometries. However, lapping and polishing does produce end face surfaces of high quality that are substantially damage free. The prior art process of preparing the end faces of a chip or die 12, after the die has been removed from the silicon wafer, involves the steps of attaching the feet 13 and 14; trimming the feet; wax bonding; mounting the die on a fixture; lapping, cleaning, and polishing one end face; lapping, cleaning, and polishing the other end face; removing from the fixture and de-waxing and cleaning. The process involves from two to four individual operators and requires a high degree of skill for the operators doing the lapping and polishing. At least two, and usually more, fixtures are involved, each requiring individual mounting of the dies. The entire process, on a per chip basis, is approximately two hours, although this figure is somewhat misleading, since the lapping and polishing steps can take as much as ten hours, whether one or sixteen chips are being done simultaneously. The end product of the above listed process steps is a die having end faces 22,22 of superior quality. On the other hand, the process is an expensive one, being labor intensive and time consuming throughout.

The process of the present invention requires fewer steps, is far less labor intensive, and requires much less time per device. Thus, the production bottleneck resulting from the lapping and polishing steps is eliminated, and the devices are far more economically manufactured.

Figure 4:
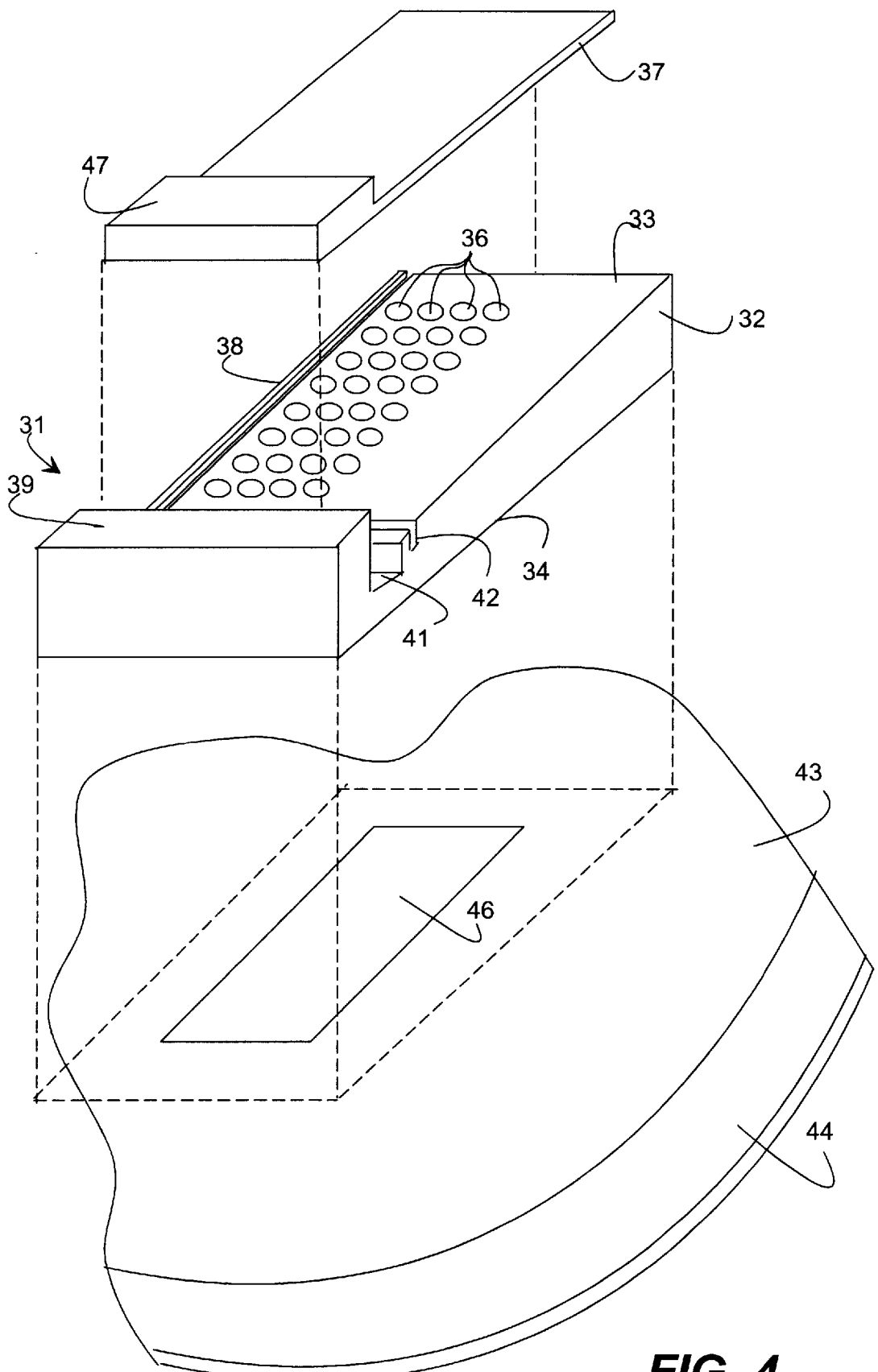
FIG. 4 is an exploded view of the apparatus of the invention as mounted on a cutting machine fixture.

In FIG. 4 there is shown the apparatus 31 of the invention, which comprises a wedge shaped member or block 32, preferably of stainless steel, having a planar top surface 33 that is sloped at an angle preferably within the range of 8° to 12° relative to the planar bottom surface 34. A plurality of vacuum bores 36 extend through the block 32 from top surface 33 to bottom surface 34. The size and number of bores 36 is chosen to insure suction holding a chip 37 firmly on the surface 33. Block 32 has, extending along the top surface 33, at one side thereof, an alignment rail 38 against which the side of chip 37 is butted when it is placed upon the top surface 33. At the lower or narrow end of block 32 is a locating rail or fence 39 which is spaced from the end of surface 33 by a clearance groove or channel 41, which provides clearance for the cutting wheel, as will be discussed more fully hereinafter. Extending across the narrow end of surface 32 is an alignment groove 42 which is useful for optically aligning the block 32 relative to the cutting machine, not shown.

The block 32, in preparation for the cutting operation, is placed upon a resilient sheet 43. The sheet or tape 43 is a sheet of suitable flexible plastic material which has an adhesive surface and which is held in stretched condition by the cutting fixture ring 44. The block 32 is placed on the adhesive surface and held in place thereby. In order that suction (or vacuum) may be applied by the cutting machine, not shown, sheet 43 has a cut-out portion 46 which is smaller than the footprint (shown in dashed lines) of the block 32 so that sheet 43 still provides support to the block 32, but which is large enough to allow substantially all of the bores 36, and hence the top surface 33, to be subject to the vacuum force of the machine.

In practice, the block 32 is placed upon sheet 43 and optically aligned with the cutting wheel by means of groove 42. The chip 37, with or without feet 47, but preferably with, is placed upon surface 33, slid into contact at one side with rail or fence 38, and slid down surface 33 until the end thereof butts against locating rail 39. The suction is then applied, and the chip 37 is held firmly in place on surface 33. The assembly is then ready for cutting by the cutting blade.

The sheet or tape 43 is a sheet of suitable flexible plastic material which has an adhesive surface and which is held in stretched condition by the cutting fixture 44. The block 32 is placed on the adhesive surface and held in place thereby. The blade itself preferably is made of a resinoid material impregnated with diamond dust having a particle size of thirty microns (30 μm). In cutting the end faces, it has been found that there are several parameters which may be optimized to produce quality end faces. By use of a blade speed of approximately thirty thousand (30 k) RPM and a feed rate (transverse movement of the blade across the end face) of approximately one and one-half millimeters per second (1.5 mm/s), high quality end faces are produced having a back reflection (BR) of less than −56.4 dB, which is well within the allowable BR limits. The efficiency of production with these parameters is maximized, being far greater than the prior art methods, which include lapping and polishing. Removal of the block 32 from the tape after the formation of the end faces simply entails pulling the die off of the adhesive surface of the tape and cleaning off any residue of adhesive.

Figure 5:
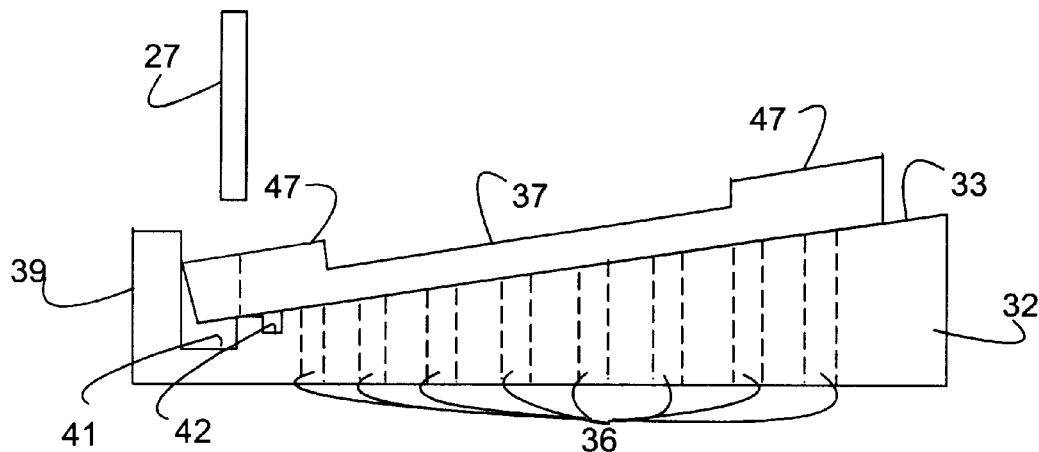
FIG. 5 is a side elevation view of one embodiment of the apparatus of the invention.

In FIG. 5 there is shown in a side elevation view, the block 32 of FIG. 4, with the chip 37, having feet 47 affixed thereto in place for cutting on top surface 33. It can be seen that the clearance channel or recess 41 allows the blade 27 to cut the end face of the chip, as shown in dashed lines, without impinging on block 32. The dashed lines represent the finished face, which is at an angle of 8° to 12° with the plane of the chip 37.

Figure 6:
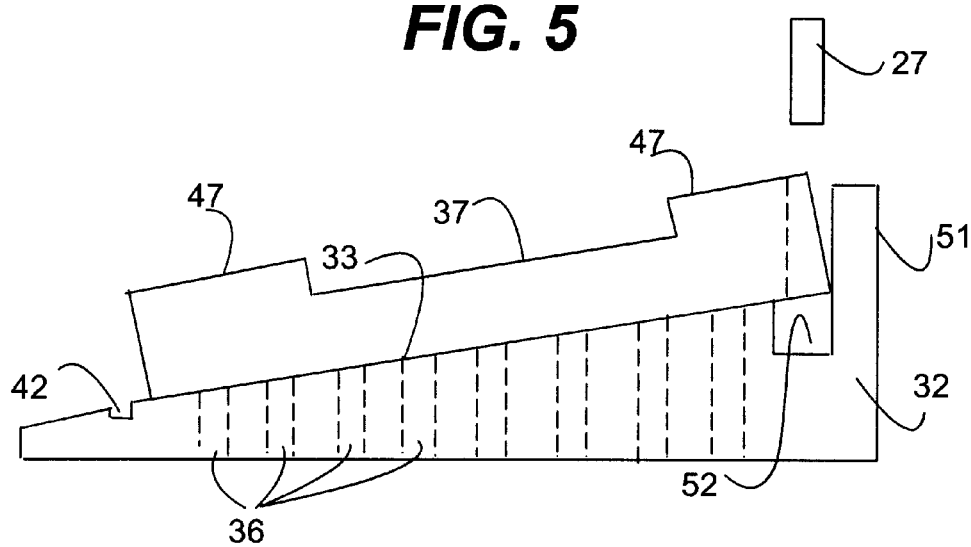
FIG. 6 is a side elevation view of a second embodiment of the apparatus of the invention.

FIG. 6 is a second embodiment of block 32 wherein a locating rail 51 and clearance channel 52 are located at the upper end thereof. This embodiment functions in the same manner as that of FIG. 5, but the angled face of the chip is 180° different in orientation from that of FIG. 5.

Figure 7:
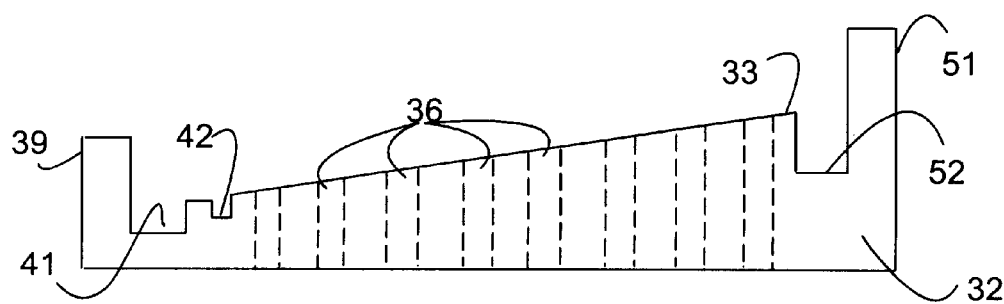
FIG. 7 is a side elevation view of a third embodiment of the apparatus of the invention.

FIG. 7 is an embodiment that is a combination of the embodiment of FIGS. 5 and 6, and is useful where the chips are short enough to fit within the space defined by rails 39 and 51.

Figure 8:
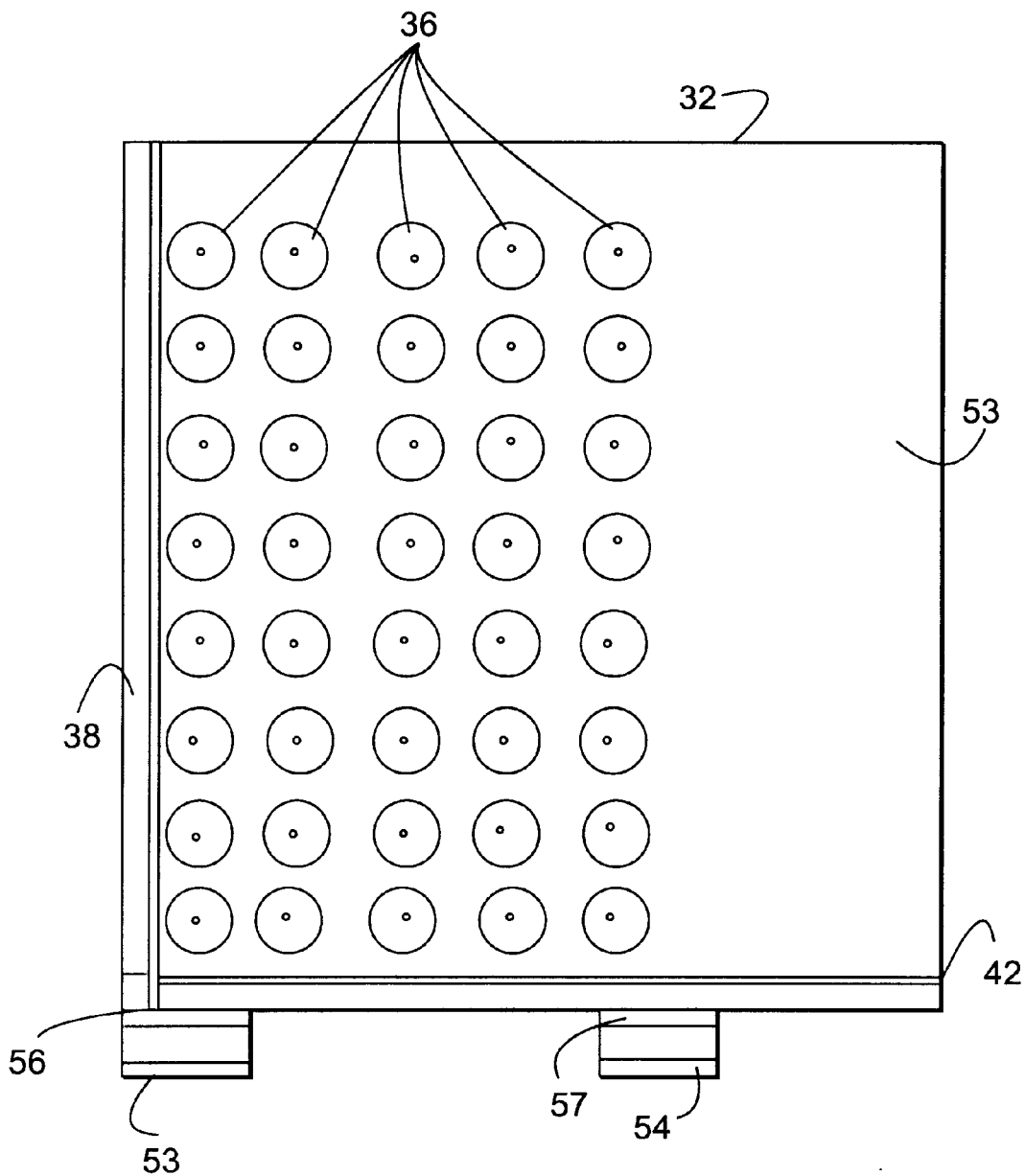
FIG. 8 is a plan view of the apparatus of the invention showing a modification to one of the components thereof.

FIG. 8 is a plan view of the top of block 32, wherein, instead of the rail or fence 39, two projections 53 and 54 are used to locate the end of the chip, and channels 56 and 57 provide clearance for the cutting blade.

The foregoing has shown only one chip being cut. It is possible to make the block 32, with a sufficient number of bores 36, large enough to accommodate two, or even more chips, where the width of the chips permits.

The method of forming end faces on the chip in accordance with the steps enumerated hereinbefore requires only one semi-skilled operator and one fixture. As pointed out in the foregoing, the elapsed time per finished chip is drastically reduced over prior art methods, and the end results are optically well within allowable limits. The foregoing description and discussion has been for purposes of illustrating the principles of the present invention in a preferred embodiment thereof. It can readily be seen that the method of the present invention, when followed, is far more economical than prior art methods while producing comparable results.

In concluding the detailed description, it will be obvious to those skilled in the art that many variations and modifications may be made to the preferred embodiment or, more accurately, the preferred method, without substantial departure from the principles of the present invention. For example, the process may be used for optical fiber arrays or other similar optical devices, such as silicon, ceramic, or GaAs based devices. All such variations and modifications are intended to be included herein as being within the scope of the present invention as set forth hereinafter in the claims. Further, in the claims, the corresponding materials, structures, acts, and equivalents of all means or step plus function elements are intended to include any structure, material, or acts for performing the functions with other claimed elements as specifically claimed.

What is claimed is:

1. A method of preparing an end face of an optical integrated circuit chip for connection at at least one end having an end foot to another circuit member, said method comprising the steps of:

mounting the chip on a holder block to position and hold the chip relative to a straight planar cutting blade of a cutting apparatus, the chip being at an angle from 78° to 82° relative to the cutting blade;

applying a holding force to the chip;

imparting an angle of from 8° to 12° to the end face of the chip and to the end foot by through cutting the chip with the rotating blade; and removing the chip from the cutting apparatus.

2. The method as claimed in claim 1 including the step of affixing the end foot to at least one end of the chip prior to mounting the chip on the holder block.

3. The method as claimed in claim 1 wherein the angle imparted to the end face of the chip and the foot is approximately 8°.

4. The method as claimed in claim 1 wherein the holding force is a vacuum.

5. The method as claimed in claim 1 and further comprising the step of mounting the block to a fixture of the cutting apparatus and aligning it relative to the cutting blade prior to mounting the chip thereon.

6. The method as claimed in claim 5 and further comprising the step of aligning the chip with the block after the block is aligned relative to the cutting blade.

7. An apparatus for use in preparing at least one end face of an integrated circuit chip comprising:

a wedge shaped chip holding block having a planar top surface and a planar bottom surface;

said top surface being at an angle of 8° to 12° to said bottom surface and adapted to hold the chip against said top surface for preventing movement of the chip with respect thereto prior to and during operation; and an alignment rail for aligning the chip relative to said block.

8. An apparatus as claimed in claim 7 wherein said block has a locating member at one end thereof against which the chip butts when mounted on said block.

9. An apparatus as claimed in claim 8 wherein said locating member comprises a rail extending across the width of said block.

10. An apparatus as claimed in claim 8 wherein said locating member comprises first and second spaced projections.

11. An apparatus as claimed in claim 8 wherein said locating member is spaced from said top surface.

12. An apparatus for use in preparing at least one end face of an integrated circuit chip comprising:

a wedge shaped chip holding block having a planar top surface and a planar bottom surface;

said top surface being at an angle of from 8° to 12° to said bottom surface and adapted to hold the chip thereon;

an alignment rail for aligning the chip relative to said block;

a locating member at one end of said block against which the chip butts when mounted on said block, said locating member being from said top surface; and a cutter blade clearance channel located between said locating member and said top surface.

13. An apparatus for use in preparing at least one end face of an integrated circuit chip comprising:

a wedge shaped chip holding block having a planar top surface and a planar bottom surface;

said top surface being at an angle of from 8° to 12° to said bottom surface and adapted to hold the chip thereon;

an alignment rail for aligning the chip relative to said block; and said block having a plurality of bores extending therethrough from said top surface to said bottom surface.

* * * * *